US010185042B2

(12) United States Patent
Yoon et al.

(10) Patent No.: US 10,185,042 B2
(45) Date of Patent: Jan. 22, 2019

(54) ARRAY SUBSTRATE OF X-RAY DETECTOR, METHOD FOR MANUFACTURING ARRAY SUBSTRATE OF X-RAY DETECTOR, DIGITAL X-RAY DETECTOR INCLUDING THE SAME, AND METHOD FOR MANUFACTURING X-RAY DETECTOR

(71) Applicant: LG Display Co., Ltd., Seoul (KR)

(72) Inventors: JaeHo Yoon, Chilgok-gun (KR); MoonSoo Kang, Daegu (KR); JaeKwang Lee, Daegu (KR); ShiHyung Park, Busan (KR)

(73) Assignee: LG Display Co., Ltd., Seoul (KR)

( * ) Notice: Subject to any disclaimer, the term of this patent is extended or adjusted under 35 U.S.C. 154(b) by 8 days.

(21) Appl. No.: 15/395,379

(22) Filed: Dec. 30, 2016

(65) Prior Publication Data

US 2017/0192109 A1    Jul. 6, 2017

(30) Foreign Application Priority Data

Dec. 31, 2015 (KR) .......................... 10-2015-0191490

(51) Int. Cl.
*G01T 1/24* (2006.01)
*H01L 27/146* (2006.01)

(52) U.S. Cl.
CPC .............. *G01T 1/243* (2013.01); *G01T 1/241* (2013.01); *G01T 1/247* (2013.01);
(Continued)

(58) Field of Classification Search
CPC ......... G01T 1/241; G01T 1/243; G01T 1/247; H01L 27/14632; H01L 27/14636; H01L 27/14687
See application file for complete search history.

(56) References Cited

U.S. PATENT DOCUMENTS 5,055,973 A * 10/1991 Mohsen .............. H01L 23/5382
174/261
5,235,176 A * 8/1993 Noble ..................... G01T 1/247
250/208.2

(Continued)

FOREIGN PATENT DOCUMENTS

JP    S55162219 A    12/1980
JP    S6085558 A    5/1985

(Continued)

OTHER PUBLICATIONS

Extended European Search Report dated Aug. 11, 2017 in corresponding European patent application No. EP 16 20 7468.

(Continued)

*Primary Examiner* — Marcus Taningco
(74) *Attorney, Agent, or Firm* — Polsinelli PC

(57) ABSTRACT

Provided are an array substrate of an X-ray detector, a digital X-ray detector including the same, a method for manufacturing an array substrate of an X-ray detector, and a method for manufacturing an X-ray detector. More specifically, provided are an array substrate of an X-ray detector which is capable of tracking a defective line with high accuracy since the array substrate includes a first line extended in a first direction, a second line extended in the first direction and apart from the first line, and a plurality of line identifiers provided between the first line and the second line, a digital X-ray detector including the same, a method for manufacturing an array substrate of an X-ray detector, and a method for manufacturing an X-ray detector.

15 Claims, 11 Drawing Sheets

(52) U.S. Cl.
CPC .. *H01L 27/14632* (2013.01); *H01L 27/14636* (2013.01); *H01L 27/14687* (2013.01)

(56) References Cited

U.S. PATENT DOCUMENTS

| | | | | |
|---|---|---|---|---|
| 5,977,488 | A * | 11/1999 | Jeon | H05K 1/0266 174/250 |
| 6,272,018 | B1 * | 8/2001 | Feld | G01R 31/2813 174/250 |
| 6,531,346 | B1 * | 3/2003 | Kim | H01L 29/4908 257/E21.414 |
| 8,922,544 | B2 * | 12/2014 | Chaji | G09G 3/00 345/212 |
| 9,817,132 | B2 * | 11/2017 | Kim | G01T 1/2018 |
| 10,020,314 | B1 * | 7/2018 | Baraskar | H01L 27/11519 |
| 2010/0007653 | A1 | 1/2010 | Ahn et al. | |
| 2010/0086198 | A1 * | 4/2010 | Tang | G06K 9/2063 382/151 |
| 2010/0155106 | A1 * | 6/2010 | Britton | H05K 1/0269 174/250 |
| 2012/0161018 | A1 * | 6/2012 | Shin | H01L 27/14658 250/370.09 |
| 2012/0217410 | A1 * | 8/2012 | Amitani | H04N 5/32 250/370.09 |
| 2012/0223046 | A1 * | 9/2012 | Galiazzo | H01L 31/02242 216/13 |
| 2017/0150611 | A1 * | 5/2017 | Zhang | H05K 1/0268 |

FOREIGN PATENT DOCUMENTS

| | | |
|---|---|---|
| JP | H0846166 A | 2/1996 |
| JP | 2014-067065 A | 4/2014 |
| KR | 1999-0085237 A | 12/1999 |
| KR | 2001-0093013 A | 10/2001 |
| KR | 2001-0104068 A | 11/2001 |
| KR | 2003-0053564 A | 7/2003 |
| KR | 2004-0058847 A | 7/2004 |
| KR | 2005-0070446 A | 7/2005 |
| KR | 2005-0122606 A | 12/2005 |
| KR | 2006-0077859 A | 7/2006 |
| KR | 2007-0003122 A | 1/2007 |
| KR | 2008-0038599 A | 5/2008 |
| KR | 2008-0108642 A | 12/2008 |
| KR | 2011-0030955 A | 3/2011 |
| KR | 2011-0066806 A | 6/2011 |
| KR | 2012-0076712 A | 7/2012 |
| KR | 2013-0049108 A | 5/2013 |
| KR | 2013-0071998 A | 7/2013 |
| KR | 2014-0061898 A | 5/2014 |
| KR | 2014-0067560 A | 6/2014 |
| KR | 2014-0091401 A | 7/2014 |
| KR | 2015-0049536 A | 5/2015 |
| KR | 2015-0067830 A | 6/2015 |
| KR | 2015-0072534 A | 6/2015 |

OTHER PUBLICATIONS

Partial European Search Report dated May 19, 2017 in corresponding European patent application No. 16 20 7468.

* cited by examiner

ARRAY SUBSTRATE OF X-RAY DETECTOR, METHOD FOR MANUFACTURING ARRAY SUBSTRATE OF X-RAY DETECTOR, DIGITAL X-RAY DETECTOR INCLUDING THE SAME, AND METHOD FOR MANUFACTURING X-RAY DETECTOR

CROSS-REFERENCE TO RELATED APPLICATIONS

This application claims the priority of Korean Patent Application No. 10-2015-0191490 filed in the Republic of Korea on Dec. 31, 2015, which is hereby incorporated by reference in its entirety.

BACKGROUND

Field of the Disclosure

The present disclosure relates to a digital X-ray detector using a thin film transistor, and more particularly, to an array substrate of an X-ray detector, a digital X-ray detector including the same, a method for manufacturing an array substrate of an X-ray detector, and a method for manufacturing an X-ray detector. Although the present disclosure is suitable for a wide scope of applications, it is particularly suitable for tracking a defective line with high accuracy in the thin film transistor array substrate of the X-ray detector.

Description of the Background

In a diagnostic X-ray examination method currently has been used for medical purposes, an X-ray sensing film is used in taking an X-ray and it takes a predetermined printing time to get a result thereof.

However, with a recent development of semiconductor technology, a digital X-ray detector using a thin film transistor has been researched and developed. The digital X-ray detector uses a thin film transistor as a switching element and thus enables a user to make a diagnosis in real time at the time of irradiating an X-ray.

Generally, the digital X-ray detectors are classified into two types, i.e., a direct type DXD and an indirect type DXD. The direct type DXD includes an amorphous selenium (Se) layer laminated on an upper layer of a thin film transistor array substrate and a transparent electrode formed on the amorphous Se layer, and detects a current as a pixel electrode of the thin film transistor receives a charge from the Se layer and then performs a signal processing. The indirect type DXD includes a scintillator, and if an X-ray is converted into a visible ray by the scintillator, the visible ray is converted into an electrical signal by a PIN diode, and then a series of signal processing is performed.

Meanwhile, in the conventional X-ray detector, a mask used for performing an exposure process to an array substrate is small. Thus, in order to manufacture a large-sized panel, a stitch shot exposure method of performing exposure by shifting the mask on a base substrate several times has been used.

Generally, if a defect, such as open or short, occurs in a signal line, a plurality of lines on an array substrate are patterned together with identifiers for the respective lines in order to find out a defective signal line on the array substrate using a detector.

However, in case of the stitch shot exposure method, an exposure process is performed by shifting the same mask several times. Thus, the same identifier is repeatedly patterned on one base substrate. FIG. 1 is a photograph of an array substrate on which identifiers are formed by a conventional stitch shot exposure method, which will be explained with reference to FIG. 1.

A mask used in FIG. 1 includes the $1^{st}$ to $256^{th}$ identifiers. Thus, the $257^{th}$ line (a line exposed by shifting the mask for the second time in the photograph of FIG. 1) becomes the $1^{st}$ identifier, which is the same identifier as the $1^{st}$ line. As such, there are more than one signal lines including the same identifier, and, thus, it is impossible to accurately find out the position of the defective signal line. Accordingly, a solution thereto is needed.

SUMMARY

Accordingly, the present disclosure is directed to an array substrate of an X-ray detector, a method for manufacturing the array substrate of the X-ray detector, a digital X-ray detector including the same, and a method for manufacturing the X-ray detector that substantially obviate one or more problems due to limitations and disadvantages of the prior art.

An object to be achieved by the present disclosure is to provide an array substrate of an X-ray detector capable of tracking a defective line with high accuracy.

Another object to be achieved by the present disclosure is to provide an array substrate of an X-ray detector capable of suppressing a defect leakage and improving the yield.

Yet another object to be achieved by the present disclosure is to provide an X-ray detector including the above-described array substrate.

According to an aspect of the present disclosure, there is provided an array substrate of an X-ray detector including a first line extended in a first direction, a second line extended in the first direction and spaced apart from the first line, and a plurality of line identifiers arranged between the first line and the second line.

According to another aspect of the present disclosure, there is provided an array substrate of an X-ray detector comprising a plurality of line groups having a plurality of lines arranged in a first direction, and a plurality of line identifiers disposed beside each of the plurality of lines. Each of the plurality of line groups includes first to nth lines (where n is a natural number) extended in a first direction and spaced apart from each other along a second direction perpendicular to the first direction. Mth lines (where m is a natural number equal to or smaller than n) of the plurality of lines have the line identifiers including a first identifier having a number m and a second identifier having a number (m+n).

According to yet another aspect of the present disclosure, there is provided an array substrate of an X-ray detector including first to pth line groups (where p is a natural number greater than 2) including a plurality of lines. The plurality of lines is extended in a first direction spaced apart from each other and includes an p number of identifiers on a lateral side.

According to yet another aspect of the present disclosure, there is provided an array substrate of an X-ray detector including first to pth line groups (where p is a natural number greater than 2) including a plurality of lines. The plurality of lines is extended in a first direction spaced apart from each other and includes a p number of identifiers on a lateral side. According to yet another aspect of the present disclosure, there is provided an X-ray detector including an array substrate having a plurality of pixels, comprising a first line extended in a first direction, a second line extended in the first direction and spaced apart from the first line, and a plurality of line identifiers arranged between the first line and the second line; a bias driver supplying a driving voltage to the array substrate; a gate driver sequentially supplying a gate pulse to a plurality of gates of the array substrate; and a read-out integrated circuit reading out a detection signal output from a turned-on transistor in response to the gate pulse.

According to still yet another aspect of the present disclosure, there is provided an array substrate of an X-ray detector including a base substrate, a plurality of gate lines on the base substrate; an active layer on the gate lines; source/drain electrodes on the active layer; a first electrode of a photosensitive part on the source/drain electrodes; a light conductor layer and a second electrode of the photosensitive part on the first electrode; a plurality of data lines and a plurality of bias lines on the second electrode; and a plurality of line identifiers disposed between at least one of the gate lines, the data lines, and the bias lines.

According to yet another aspect of the present disclosure, there is provided a method for manufacturing an array substrate of an X-ray detector, including forming a gate line on a substrate, forming an active layer on the gate line, forming source/drain electrodes on the active layer, forming a lower electrode on the source/drain electrode, forming a light conductor layer and an upper electrode on the lower electrode, and forming a data line and a bias line on the upper electrode. At least one of the gate line, the data line, and the bias line is formed by including an exposure process using a mask configured to form a plurality of line identifiers between adjacent lines.

According to the present disclosure, an array substrate of an X-ray detector can track a defective line with high accuracy. Therefore, a repair process may be performed to the defective line.

According to the present disclosure, an X-ray detector includes the above-described array substrate and thus suppresses a defect leakage, reduces RMA costs, and remarkably improves the yield.

It is to be understood that both the foregoing general description and the following detailed description are exemplary and explanatory and are intended to provide further explanation of the disclosure as claimed.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
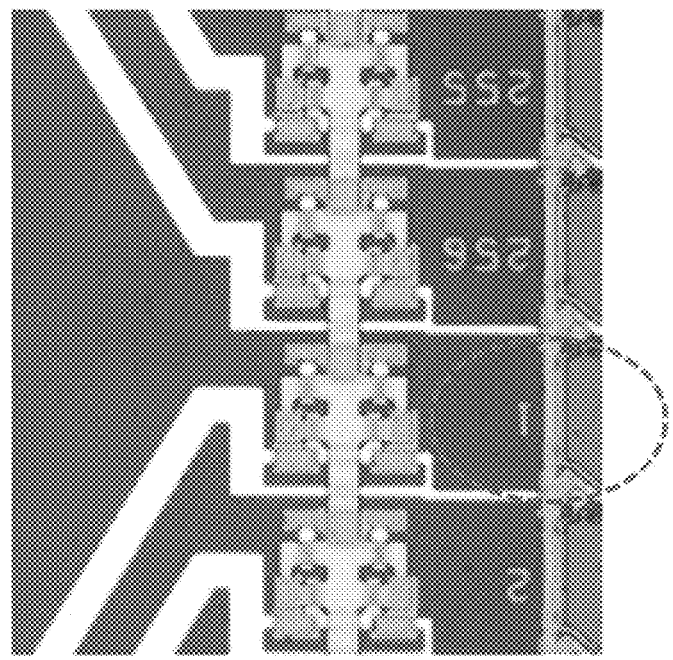
FIG. 1 is a photograph of an array substrate on which identifiers are formed by a conventional stitch shot exposure method.

In the present disclosure, it will be understood that when a film, a layer, an electrode, a plate, or a substrate is described as being formed "on" or "under" another element in the aspects, it may be directly on or under the other element, or intervening elements (indirectly) may be present.

The term "on", "beside", or "under" of an element will be determined based on the drawings. The sizes of elements may be expressed to be exaggerated for the sake of convenience in the drawings, but do not reflect actual sizes thereof.

Hereinafter, exemplary aspects of the present disclosure will be described in detail with reference to the accompanying drawings.

Figure 2:
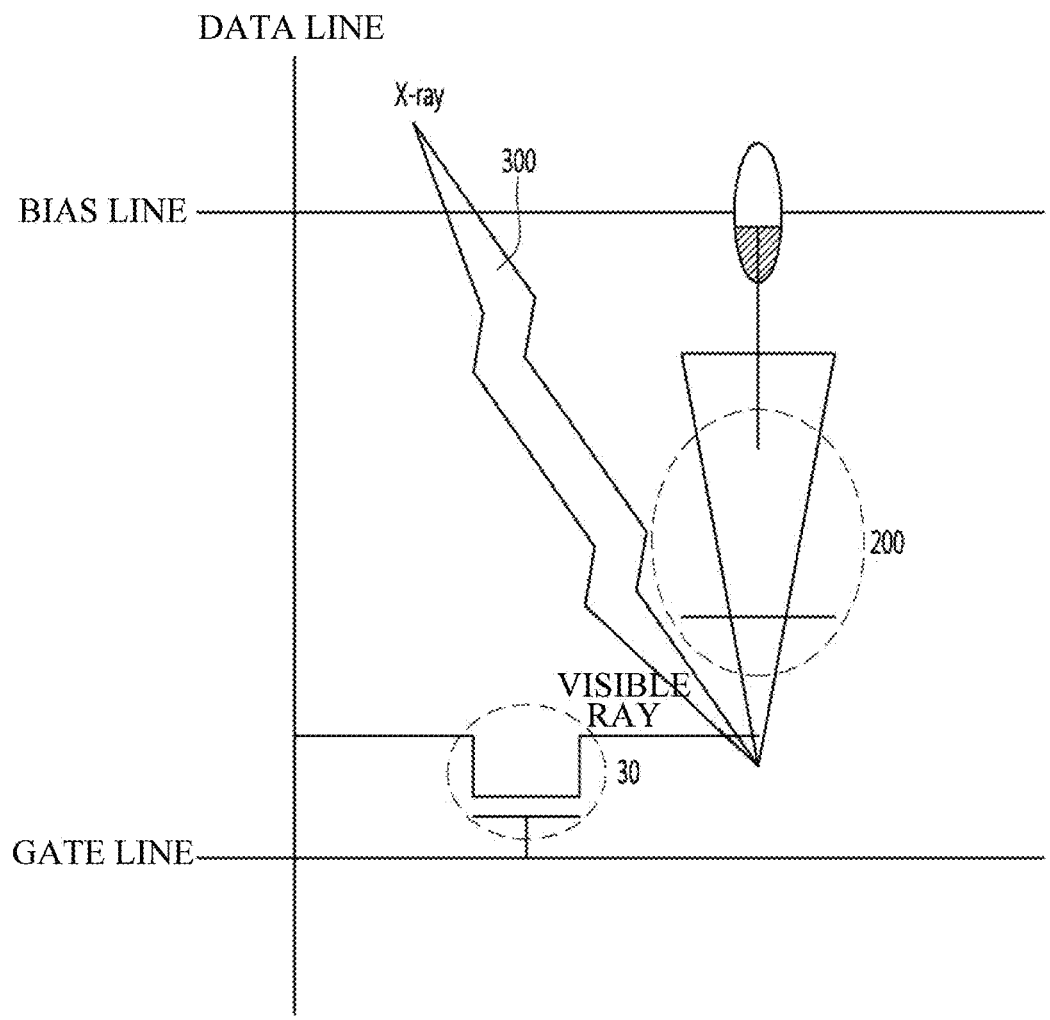
FIG. 2 is a cross-sectional view illustrating an operation of an X-ray detector in accordance with an aspect of the present disclosure.
Figure 3:
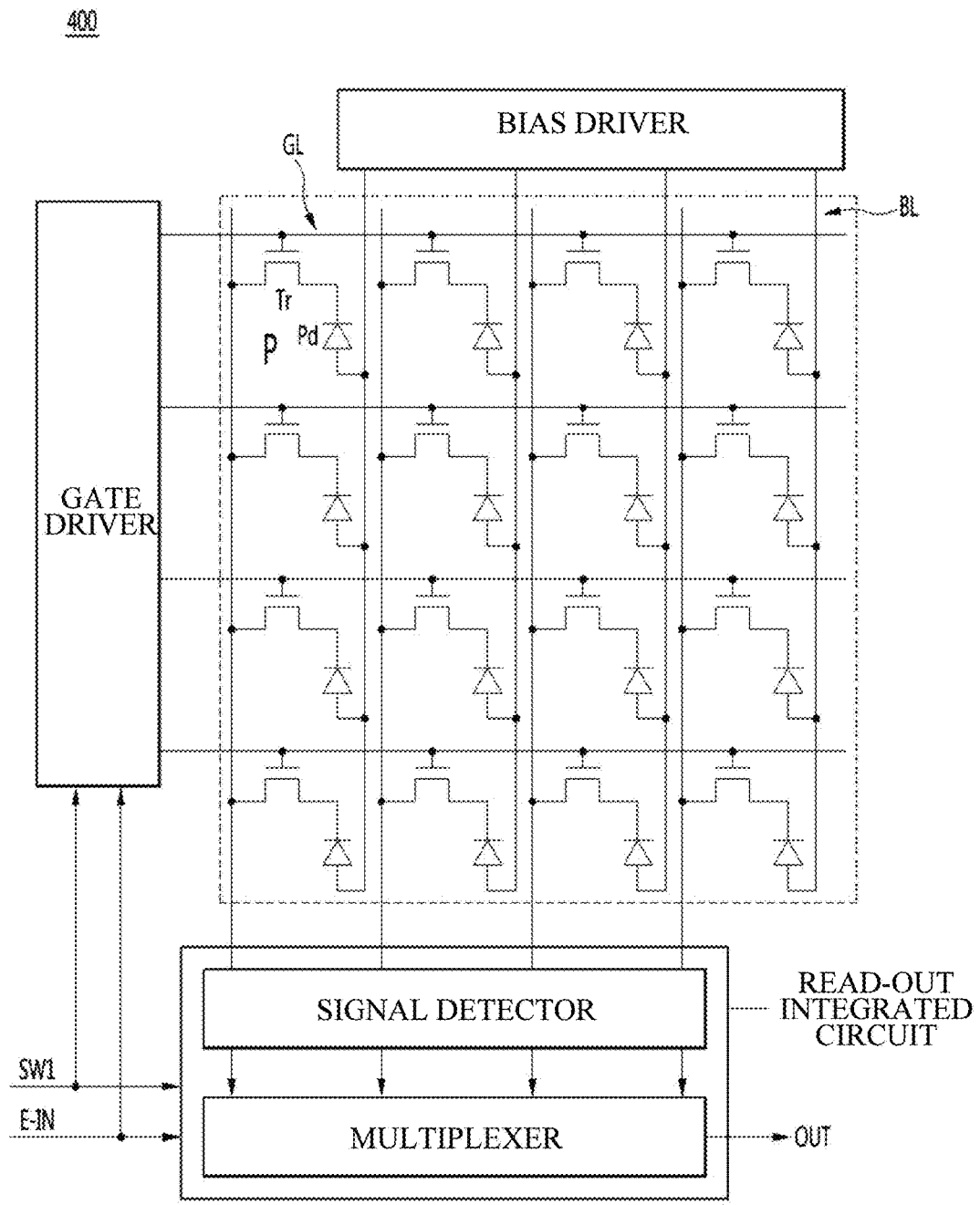
FIG. 3 is a diagram schematically illustrating a structure of the X-ray detector in accordance with an aspect of the present disclosure.

FIG. 2 is a cross-sectional view illustrating an operation of an X-ray detector in accordance with an aspect of the present disclosure. FIG. 3 is a diagram schematically illustrating a structure of the X-ray detector in accordance with an aspect of the present disclosure.

In an indirect type X-ray detector, a photosensitive part 200 is formed on an array substrate and a light conversion part 300 is disposed at an upper part of the photosensitive part 200 in order to detect an X-ray.

The light conversion part 300 irradiated with an X-ray as illustrated in FIG. 2 converts the X-ray into light with a most sensitive wavelength range to the photosensitive part 200 and the converted light is converted into an electrical signal. The converted electrical signal is transmitted as an image signal by a thin film transistor. The thin film transistor illustrated in FIG. 2 and FIG. 3 includes a gate electrode, a first insulation layer on the gate electrode, an active layer on the first insulation layer, a source electrode, and a drain electrode. The source electrode and the drain electrode are connected to one end and the other end of the active layer and apart from each other.

Further, as illustrated in FIG. 3, an X-ray detector 400 in accordance with an aspect of the present disclosure includes a plurality of pixel unit P, a bias driver, a gate driver, and a read-out integrated circuit.

Each pixel unit P senses an X-ray emitted from an X-ray generator and photoelectrically converts the sensed signal and then outputs the sensed signal as an electrical detection signal.

The pixel unit includes a plurality of photosensitive pixels aligned in a matrix adjacent to intersections where a plurality of gate lines GL and a plurality of data lines DL intersect with each other. The plurality of gate lines GL and the plurality of data lines DL may be disposed to be substantially orthogonal to each other. FIG. 3 illustrates sixteen (16) photosensitive pixels P disposed in 4 rows and 4 columns, as an example. However, the present disclosure is not limited thereto. The number of photosensitive pixels P may be selected variously.

Each of the photosensitive pixels P includes a photosensitive part Pd configured to sense an X-ray and output a detection signal, e.g., a light detection voltage, and a transistor Tr as a switching element configured to transfer an electrical signal output from the photosensitive part in response to a gate pulse.

The photosensitive part Pd according to the present disclosure senses an X-ray emitted from the X-ray generator and outputs a sensed signal as a detection signal. The photosensitive part Pd may be an element, e.g., a PIN diode, configured to convert incident light into an electrical signal by a photoelectric effect.

The transistor Tr is a switching element configured to transfer the detection signal output from the photosensitive part Pd. The gate electrode of the transistor is electrically connected to the gate line GL, and the source electrode is electrically connected to the read-out integrated circuit through the data line DL.

The bias driver applies a driving voltage through a plurality of bias lines BL. The bias driver may selectively apply a reverse bias or a forward bias to the photosensitive part Pd.

The gate driver sequentially applies gate pulses having a gate-on voltage level through the plurality of gate lines GL. The transistors Tr of the photosensitive pixels P are turned on in response to the gate pulses. If the transistor is turned on, the detection signal output from the photosensitive part Pd is input into the read-out integrated circuit through the transistor Tr and the data line DL.

The gate driver may be mounted in an IC form at one side of the pixel unit, or formed on a substrate, such as the pixel unit, through a thin film manufacturing process.

The read-out integrated circuit reads out the detection signal output from the turned-on transistor in response to the gate pulses. The read-out integrated circuit reads out the detection signal output from the photosensitive pixel P in an offset read-out region to read out an offset image and an X-ray read-out region to read out the detection signal after X-ray exposure.

The read-out integrated circuit reads out/transfers the detection signal into a predetermined signal processor, and the signal processor digitizes the detection signal and then represents the detection signal as an image. The read-out integrated circuit may include a signal detector and a multiplexer. In this case, the signal detector may include a plurality of amplification units that correspond to the plurality of data lines DL on a one to one basis. Each amplification unit may include an amplifier, a capacitor, and a reset device.

Figure 4:
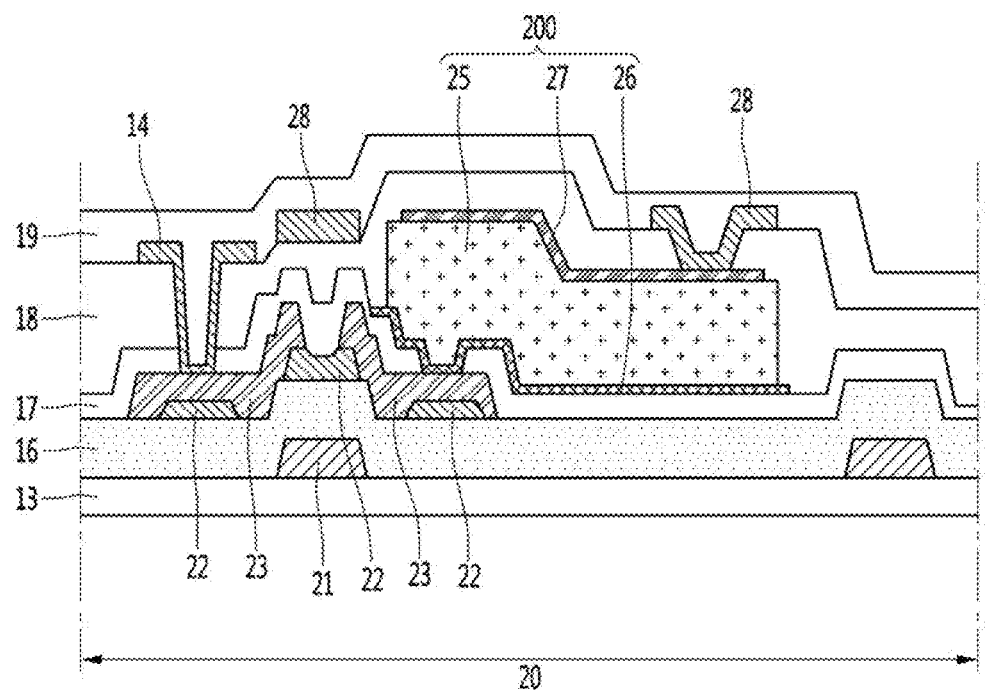
FIG. 4 is a cross-sectional view of an active area of an array substrate in accordance with an aspect of the present disclosure.

FIG. 4 is a cross-sectional view of an active area 20 of an array substrate 100 in accordance with an aspect of the present disclosure, which will be explained with reference to FIG. 4.

The active area 20 includes a plurality of data lines 14, a plurality of gate lines, and a plurality of pixel areas defined by the plurality of data lines 14 and the plurality of gate lines intersecting with each other. The active area 20 further includes a plurality of photosensitive parts 200 disposed in the respective pixel areas and configured to covert a photoelectric signal into an electrical signal and a plurality of thin film transistors 30 having a switching function to drive the plurality of photosensitive parts 200.

The thin film transistor 30 includes a gate electrode 21 connected to a gate line, an active layer 22 on the gate electrode 21, a source electrode 23 connecting one end of the active layer 22 and the data line 14, and a drain electrode 23 connected to the other end of the active layer 22. The drain electrode 23 is connected to the photosensitive part 200.

The array substrate 100 further includes the data line 14 connected to the source electrode 23 and a bias line 28 configured to apply a bias voltage which can control an electron or a hole of the photosensitive part 200. The bias line 28 is formed of an opaque metal material.

The gate electrode 21 may be formed of a material such as aluminum (Al), molybdenum (Mo), and an alloy thereof, but is not necessarily limited thereto.

The active layer 22 may include a first amorphous silicon layer which is not doped with impurities and a second amorphous silicon layer doped with N-type impurities.

The source/drain electrode 23 may be formed of a material such as aluminum (Al), molybdenum (Mo), and an alloy thereof, but is not necessarily limited thereto.

A second insulation layer 17 includes a first contact hole that exposes a portion of the drain electrode 23. The source electrode 23 is connected to the data line 14 and the drain electrode 23 is connected to a lower electrode 26 of the photosensitive part 200 through first contact hole.

A third insulation layer 18 is formed on the second insulation layer 17 and on an upper electrode 27 of the photosensitive part 200. The third insulation layer 18 includes a second contact hole that exposes a portion of the upper electrode 27. The upper electrode 27 is connected to the bias line 28 through the second contact hole.

A fourth insulation 19 is formed on the third insulation layer 18 and on the bias line 28. The fourth insulation 19 does not have a contact hole within the active area 20.

According to a first aspect of the present disclosure, the array substrate of the X-ray detector includes a first line extended in a first direction, a second line extended in the first direction and spaced apart from the first line, and a plurality of line identifiers arranged between the first line and the second line.

As described above, according to the conventional stitch shot exposure method, a plurality of lines includes the same identifier, and, thus, it is impossible to accurately find out a defective signal line.

Figure 5:
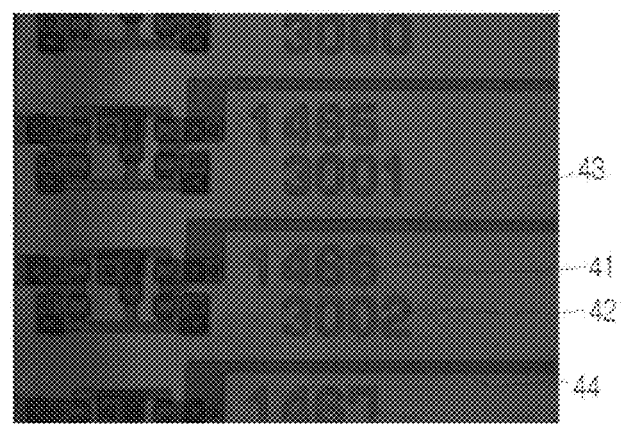
FIG. 5 is a photograph of a line including a plurality of identifiers in accordance with an aspect of the present disclosure.

FIG. 5 is a photograph of a line including a plurality of identifiers in accordance with an aspect of the present disclosure. In the present disclosure, as illustrated in FIG. 5, a plurality of line identifiers 41 and 42 is arranged between signal lines 43 and 44, and, thus, it is possible to easily detect a position of a defective line according to a method described below. That is, even if an exposure process is performed by shifting the same mask, it is possible to track an accurate position of a defect in the signal lines 43 and 44 according to the present disclosure by the plurality of line identifiers 41 and 42 arranged on the array substrate. Therefore, a repair process can be performed to the defective line by using the plurality of line identifiers 41 and 42. Thus, it is possible to suppress a defect leakage, reduce RMA (Return Material Authorization) costs, and remarkably improve the yield.

The line is arranged on the array substrate of the present disclosure, and may be any one of a gate line, a data line, and a bias line. The line is not particularly limited in kind as long as it is formed on an array substrate of an X-ray detector through a mask within the scope without departing from the purpose of the present disclosure.

The plurality of line identifiers 41 and 42 are not particularly limited in kind as long as they are within the scope without departing from the purpose of the present disclosure. Specifically, each of the plurality of line identifiers 41 and 42 may include at least one of numbers, letters, symbols, and shapes.

A first identifier 41 and a second identifier 42 arranged in the first line are not necessarily continuous but may be discontinuous with the first identifier 41 and the second identifier 42 arranged in the second line. Identifiers between the adjacent lines 43 and 44 can be continuous in terms of easiness to detect a position of a defective line.

According to a second aspect of the present disclosure, an array substrate of an X-ray detector may include a plurality of line groups. Each of line groups includes n number of lines from a first line to an nth line (n is a natural number). The n number of lines are extended in a first direction. The first line to the nth line are arranged in series along a second direction perpendicular to the first direction and spaced apart from each other. A plurality of line identifiers is disposed beside each of the plurality of lines, for example, an mth line (m is a natural number equal to or smaller than n) of the line group. The plurality of line identifiers includes a first identifier 41 representing a number m and a second identifier 42 representing a number m+n.

According to a third aspect of the present disclosure, an array substrate of an X-ray detector may include a plurality of line groups. Each of line groups includes n number of lines from a first line to an nth line (n is a natural number). The n number of lines are extended in a first direction. The first line to the nth line are arranged in series along a second direction perpendicular to the first direction and spaced apart from each other. A plurality of line identifiers is disposed beside each of the plurality of lines, for example, an mth line (m is a natural number equal to or smaller than n) of the line group. The plurality of line identifiers includes a first identifier 41 that indicates the mth line of a first line group and a second identifier 42 that indicates an mth line of the second line group.

In the third exemplary aspect, the line identifiers are not necessarily limited to numbers. In the same manner as the first aspect, each of the first identifier 41 and the second identifier 42 may include at least one of numbers, letters, symbols, and shapes.

According to a fourth exemplary aspect of the present disclosure, an array substrate of an X-ray detector may include a plurality of line groups, first to pth lines (p is a natural number). Each of the plurality of line groups includes a plurality of lines. The plurality of lines is extended in a first direction as being apart from each other and may include n number of identifiers on a lateral side.

In the fourth aspect, the line identifiers are not necessarily limited to numbers, and the line identifiers of the plurality of lines included in the groups of first to nth lines may be different from each other. That is, in the same manner as the first aspect, each of the first identifier 41 and the second identifier 42 may include at least one of numbers, letters, symbols, and shapes.

Further, xth lines among the plurality of lines included in each of the plurality of line groups may include p number of line identifiers identical to each other (x is a natural number).

The configuration and the effect of the first aspect are similarly applied to the second to fourth aspects within the scope without departing from the purpose of the present disclosure. Therefore, detailed descriptions of the second to fourth aspects, which may be the same as those of the first aspect, are omitted in the present disclosure.

Figure 6A:
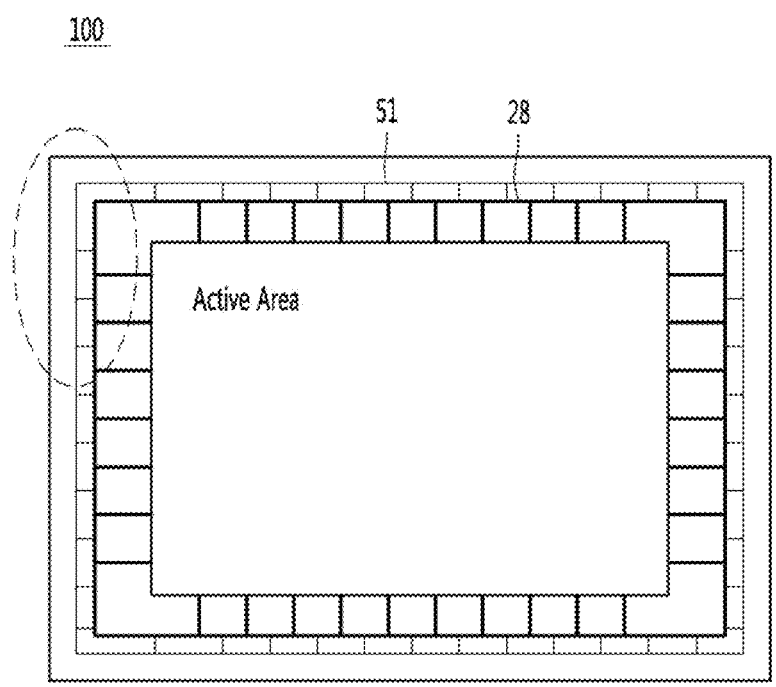
FIG. 6A is a plan view schematically illustrating an array substrate including a bias line connected to a closed loop-shaped ground line in accordance with an aspect of the present disclosure.
Figure 6B:
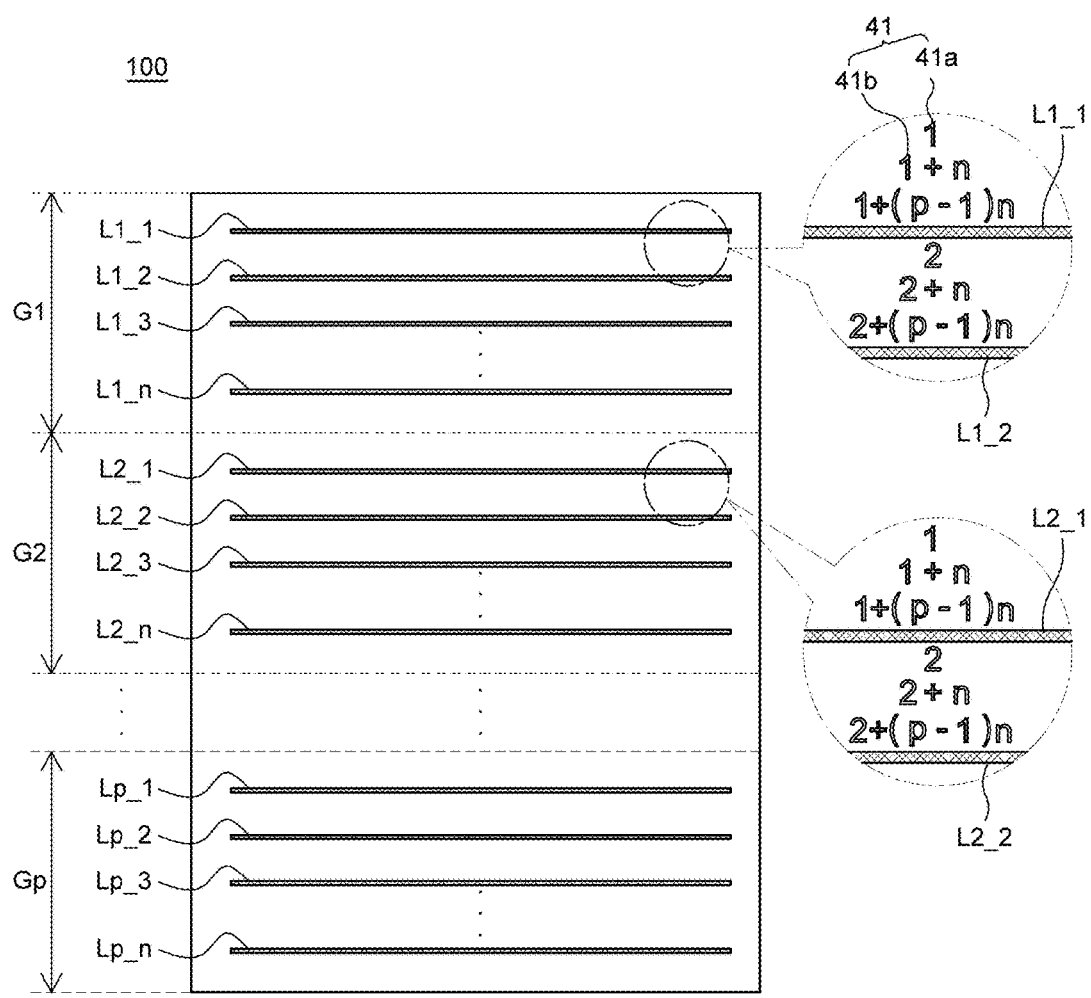
FIG. 6B and FIG. 6C are schematic plan views provided to explain line identifiers for identifying a line in the array substrate in accordance with an aspect of the present disclosure.
Figure 6C:
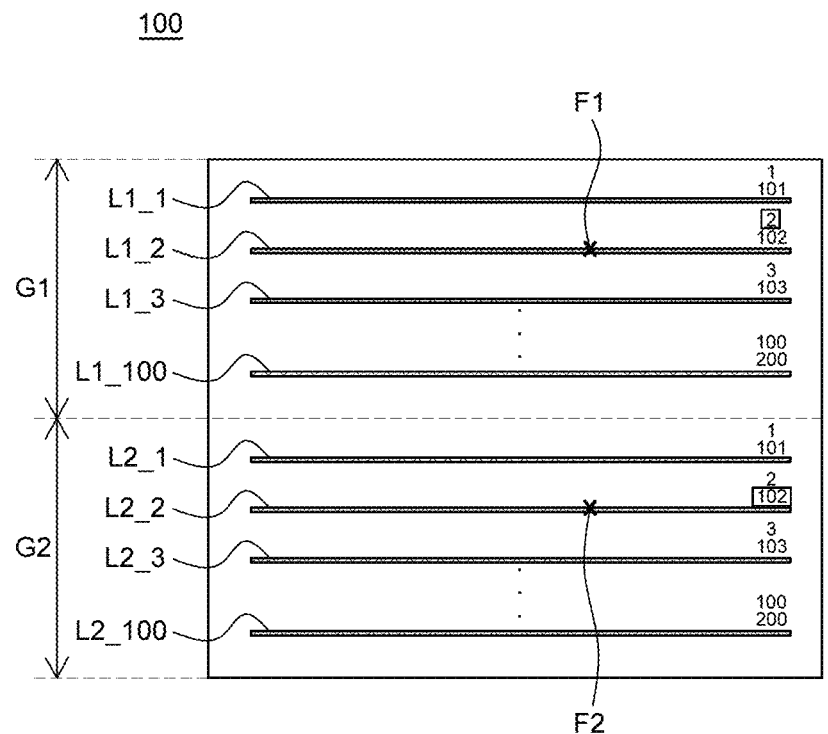

Hereinafter, a method for detecting line identifiers for identifying a line and a position of a defective line in the array substrate of the present disclosure will be described in detail with reference to FIG. 6B and FIG. 6C. FIG. 6B and FIG. 6C are schematic plan views provided to explain line identifiers for identifying a line in the array substrate in accordance with an aspect of the present disclosure.

FIG. 6B illustrates only a plurality of lines L1_1, L1_2, ... Lp_n disposed on the array substrate 100 and line identifiers 41 respectively corresponding to the plurality of lines L1_1, L1_2, ... Lp_n, for convenience in explanation. Referring to FIG. 6B, the array substrate 100 is divided into p number of line groups G1, G2, ..., Gp. An area for the line groups G1, G2, ..., Gp illustrated in FIG. 6B may be defined corresponding to the limited size of the mask as described above. Each of p line groups G1, G2, ..., Gp includes n number of lines Lp_1, ... Lp_n. Herein, p and n are natural numbers greater than 2. Herein, n lines include from a first line Lp_to an nth line Lp_n, and each of n number of lines Lp_1, ... Lp_n is arranged to be extended in a first direction. Herein, p line groups G1, G2, ..., Gp include from a first line group G1 to a pth line group Gp. The p line groups G1, G2, ..., Gp are disposed in parallel along a second direction perpendicular to the first direction. In the following, an mth line from the top in each of the line groups G1, G2, ..., Gp will be referred to as an mth line (m is a natural number equal to or smaller than n) for convenience in explanation.

The line identifiers 41 are disposed adjacent to each line in the above-described line groups. The number of line identifiers 41 may be equal to the number of line groups. For example, if there were p number of line groups G1, G2, ... Gp, there exists p line identifiers. The p line identifiers include a first identifier 41a that indicates the mth line, a second identifier 41b that indicates an (m+n)th line, and a pth identifier that indicates an (m+(p−1)n)th line. The p line identifiers may be disposed adjacent to a line L1_1. Referring to an enlarged view of a portion of the line group G1 in FIG. 6B, the line identifiers 41 indicating 1, 1+n, ... 1+(p−1)n are displayed adjacent to a first line L1_1 of the first line group G1. Further, line identifiers indicating 2, 2+n, ..., 2+(P−1)n are displayed adjacent to a second line L1_2 of the first line group G1. Referring to an enlarged view of a portion of a line group G2 in FIG. 6B, line identifiers indicating 1, 1+n, ... 1+(p−1)n are displayed adjacent to a first line L2_1 of the second line group G2 formed using the same mask. Further, line identifiers indicating 2, 2+n, ..., 2+(P−1)n are displayed adjacent to a second line L2_2 of the second line group G2. Herein, the first line L1_1 of the first line group G1 needs to be identified by the line identifier 41a that indicates 1, and the first line L2_1 of the second line group G2 needs to be identified by the line identifier 41b that indicates 1+n.

That is, a plurality of lines (mth line) with a plurality of same identifiers is present on the array substrate. Therefore, it is necessary to identify which line group a specific line belongs to. It is possible to determine which line group a specific line belongs to on the basis of position information obtained by a defect detector.

The defect detector extracts a relative position of a defective line with respect to predetermined reference coordinates of the array substrate. If the defective line is determined as being disposed in an sth line group (herein, s is a natural number equal to or smaller than p) among the first to pth line groups on the basis of the extracted relative position, an (m+(s−1)n)th identifier in the sth line group in which the defective line is determined as being present is determined as an identifier for the defective line.

Specifically, a method for determining which line identifier of a plurality of line identifiers is a true line identifier for a line will be described with reference to FIG. 6C. For example, the first to pth line groups are disposed in series from top toward bottom along a vertical direction on the array substrate, and FIG. 6C illustrates the case where the p is 2. Referring to FIG. 6C, the array substrate 100 includes the first line group G1 and the second line group G2. In this case, if a position F1 of the detected defective line is determined as being on a lower side from the center of the array substrate 100, the defective line may be determined as an 102nd line disposed in the second line group G2.

Further, in FIG. 6C, if a position F2 of the detected defective line is determined as being on an upper side from the center of the array substrate 100, the defective line may be determined as a 2nd line disposed in the first line group G1. Accordingly, even if a line and a line identifier adjacent thereto are formed by repeatedly using a mask having a limited size, it is possible to accurately specify a defective line since there is provided a plurality of line identifiers.

Figure 7:
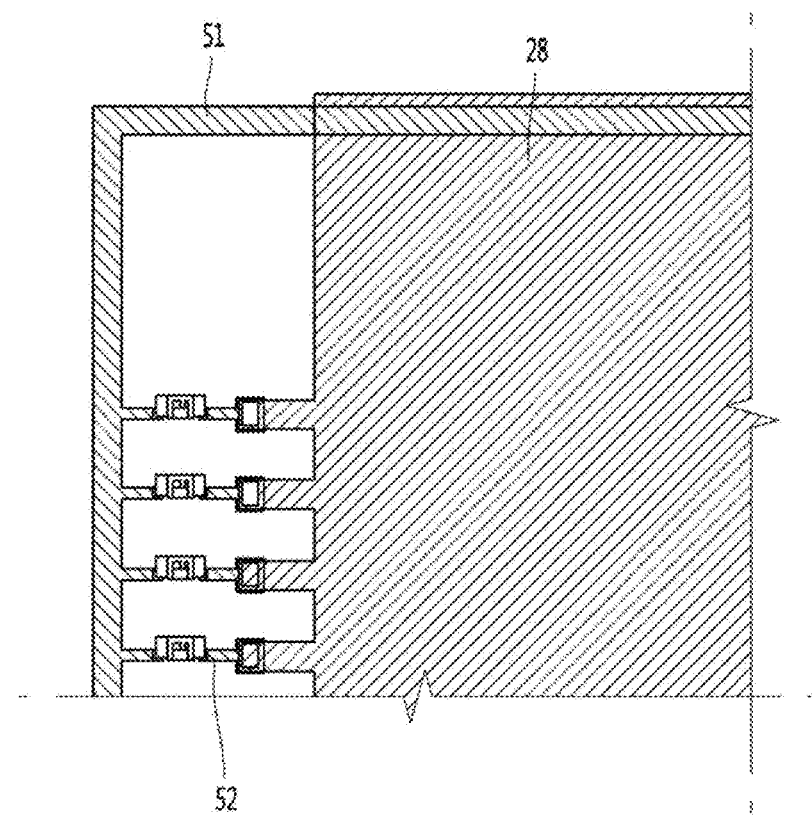
FIG. 7 is an enlarged view of an area of the array substrate illustrated in FIG. 6A.

According to an aspect of the present disclosure, if the signal line including a plurality of line identifiers is a bias line, the line may be connected to a closed loop-shaped ground line. FIG. 6A is a plan view schematically illustrating an array substrate including a bias line connected to a closed loop-shaped ground line in accordance with an aspect of the present disclosure. FIG. 7 is an enlarged view of a dotted line oval area of the array substrate illustrated in FIG. 6A.

In an array substrate of an X-ray detector, only a bias line to which a reverse voltage is applied is provided in the form of closed loop. Thus, when a positive polarity ESD (Electrostatic Discharge) is induced in the bias line, there is no electrostatic discharge path. However, according to the above-described aspect of the present disclosure, a ground line 51 connecting the bias line 28 and an ESD circuit 52 is formed into a closed loop shape as illustrated in FIG. 6A and FIG. 7. Thus, even if a positive polarity ESD is induced in the bias line 28, the positive polarity ESD is diverted to the ground line 51 so as not to affect the inside (i.e. active area) of the array substrate 100.

According to an aspect of the present disclosure, if the line is a bias line, the bias line may overlap any one of the gate line and the data line.

In the array substrate of the X-ray detector, a bias line is disposed to pass through the middle of a pixel area. Thus, as an aperture ratio is decreased, a fill factor is decreased.

Figure 8:
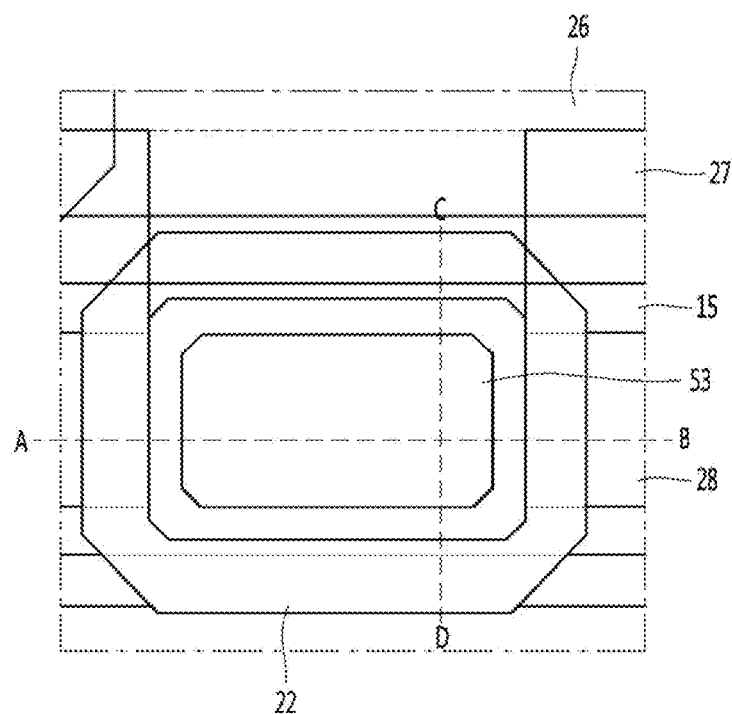
FIG. 8 is a plan view of a part of the array substrate on which a bias line is disposed on a gate line in accordance with an aspect of the present disclosure.
Figure 9:
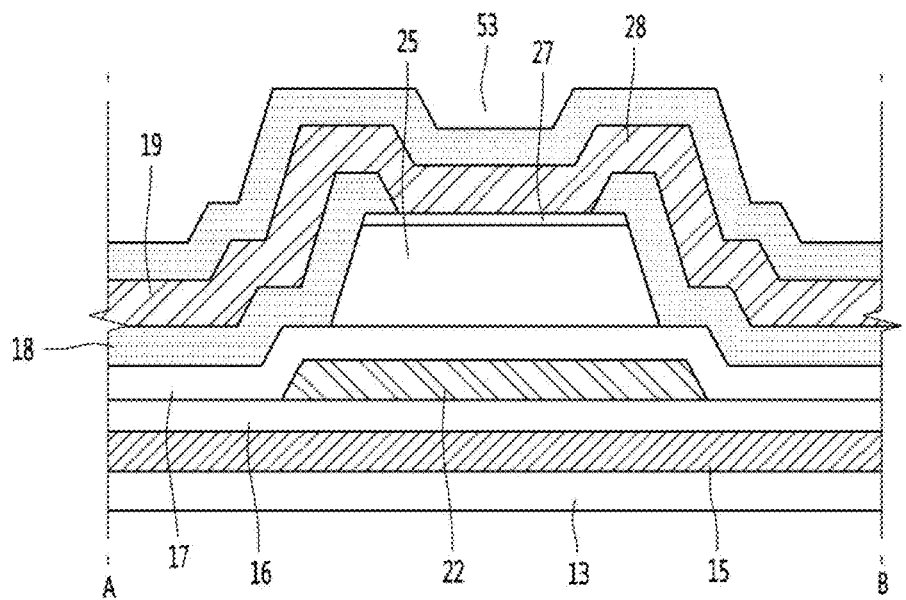
FIG. 9 is a cross-sectional view of the array substrate taken along the line A-B of FIG. 8.
Figure 10:
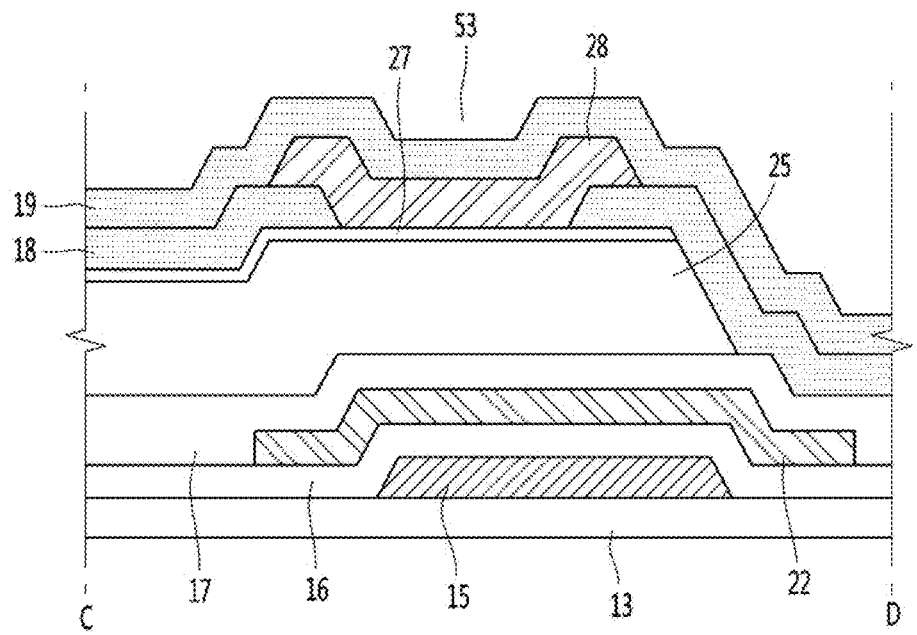
FIG. 10 is a cross-sectional view of the array substrate taken along the line C-D of FIG. 8.

FIG. 8 is a plan view of a part of an array substrate on which a bias line 28 is disposed on a gate line in accordance with an exemplary aspect of the present disclosure. FIG. 9 is a cross-sectional view of the array substrate taken along the line A-B of FIG. 8, and FIG. 10 is a cross-sectional view of the array substrate taken along the line C-D of FIG. 8. Referring to FIG. 8 and FIG. 9, the bias line 28 is disposed to overlap a gate line 15 or a data line 14 (shown in FIG. 4). More specifically, the bias line 28 is connected to one area of the upper electrode 27 provided on the gate line 15 through a hole 53 in the third insulation layer 18. Since the gate line 15 or the data line 14 is provided in a non-aperture area, the bias line 28 is also disposed in the non-aperture area. Thus, the above-described problem can be solved and a high aperture ratio can be achieved in the present disclosure. In addition, along with an increase in a fill factor, a QE (external quality factor) can be improved.

Further, as described above, a conventional bias line is disposed to pass through the middle of a pixel area. Thus, an aperture ratio of a panel is decreased and the pixel area is separated into two sections, so that resolution interference can occur.

Figure 11:
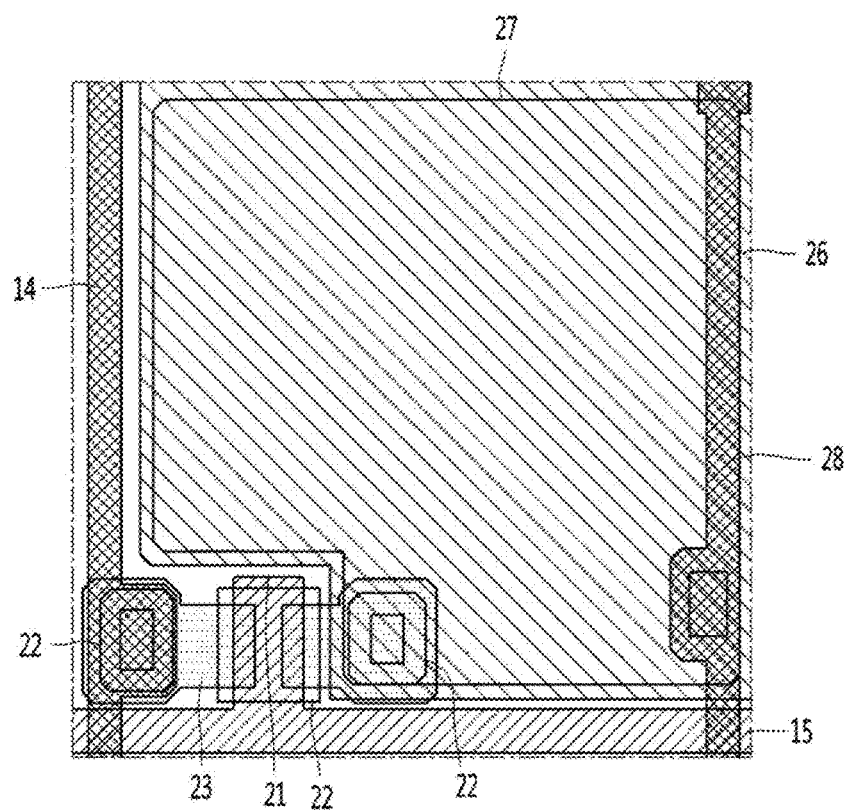
FIG. 11 is a plan view of a part of the array substrate on which a bias line is disposed at an outer periphery of a photosensitive part in accordance with an aspect of the present disclosure.

FIG. 11 is a plan view of a part of an array substrate on which a bias line is disposed at an outer periphery of a photosensitive part in accordance with an aspect of the present disclosure. As illustrated in FIG. 11, according to an aspect of the present disclosure, if the line is a bias line 28, the bias line 28 is provided at an outer periphery of a photosensitive part of the array substrate. Thus, a pixel area is not separated, so that the occurrence of resolution interference can be suppressed. Further, a high aperture ratio can be achieved, so that a high fill factor performance can be implemented.

An X-ray detector of the present disclosure includes the above-described array substrate 100 of an X-ray detector of the present disclosure (referring back to FIG. 2 through FIG. 5 hereinafter).

Therefore, detailed descriptions of its configuration and effect, which are redundant within the scope of the above descriptions, are omitted.

The photosensitive part 200 provided in the X-ray detector of the present disclosure functions to convert an optical signal into an electrical detection signal. Herein, the optical signal is incident in a state of being converted into a visible ray wavelength range through a light conversion part, which will be described later. The amount of current flowing in the photosensitive part varies depending on the transmittance of light. Specifically, the photosensitive part 200 may be a PIN diode.

The photosensitive part 200 includes a lower electrode 26 of the array substrate 100, a light conductor layer 25 on the lower electrode 26, and an upper electrode 27 on the light conductor layer 25. The light conductor layer 25 may include one of an N-type semiconductor layer doped with N-type impurities, an intrinsic semiconductor layer without including impurities, and a P-type semiconductor layer doped with P-type impurities.

The lower electrode 26 of the photosensitive part 200 is electrically connected to the drain electrode 23 of the thin film transistor 30. The upper electrode 27 is electrically connected to the bias line 28 to which a bias voltage is applied.

The light conversion part 300 provided in the X-ray detector of the present disclosure is provided at an upper part of the photosensitive part 200, and more specifically on a third protective layer 19 of the array substrate 100.

The light conversion part 300 converts an X-ray incident from an X-ray generator through an object into a green light having a wavelength of about 550 nm in a visible ray range and then transfers the green light toward the pixel unit. The light conversion part 300 may be formed of cesium iodide (CsI).

The X-ray detector of the present disclosure may include the array substrate having lines with a plurality of identifiers. Thus, it is possible to accurately find out a position of a defective line. Therefore, it is possible to suppress a defect leakage and remarkably improve the yield.

A method for manufacturing an array substrate of an X-ray detector of the present disclosure includes forming a gate line on a substrate, forming an active layer on the gate line, forming a source/drain electrode on the active layer, forming a lower electrode on the source/drain electrode, forming a light conductor layer and an upper electrode on the lower electrode, and forming a data line and a bias line on the upper electrode. At least any one of the gate line, the data line, and the bias line is formed by an exposure process using a mask configured to form a plurality of line identifiers between adjacent lines.

Figure 12:
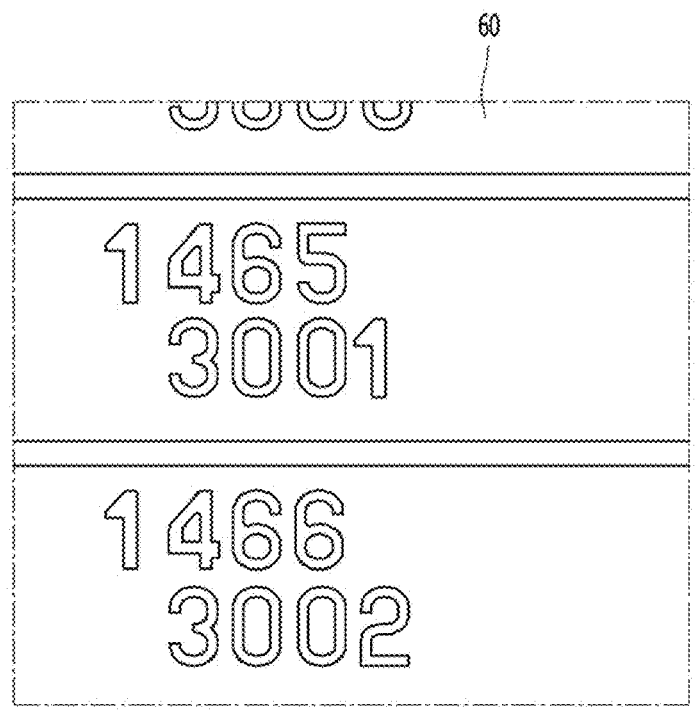
FIG. 12 is a diagram schematically illustrating a mask used for manufacturing an array substrate of an X-ray detector of the present disclosure.

FIG. 12 is a diagram schematically illustrating a mask used for manufacturing an array substrate of an X-ray detector of the present disclosure. As illustrated in FIG. 12, an array substrate of an X-ray detector manufactured by a method of the present disclosure includes at least one of a gate line, a data line, and a bias line formed by an exposure process using a mask 60 of the present disclosure. Thus, if a defect occurs in a line of the array substrate, the array substrate makes it possible to accurately track a position of the line. Therefore, it is possible to suppress a defect leakage, reduce RMA (Return Material Authorization) costs, and remarkably improve the yield.

According to an aspect of the present disclosure, the mask 60 may include a line group pattern in which each of n number of lines from a first line to an nth line (n is a natural number) is arranged as being extended in a first direction and the first line to the nth line are arranged in series along a second direction perpendicular to the first direction and spaced apart from each other, and a plurality of line identifier patterns arranged beside an mth line (m is a natural number equal to or smaller than n) of the line group pattern. According to the above-described aspect, the mask 60 used for an exposure process includes the n number of lines, the line group pattern, and the plurality of line identifier patterns. Thus, when lines are formed on the array substrate, a plurality of line identifiers is also formed, so that it is possible to accurately track a position of a defective line.

According to an aspect of the present disclosure, each of a plurality of line identifiers formed using the mask may include at least one of numbers, letters, symbols, and shapes.

Figure 13:
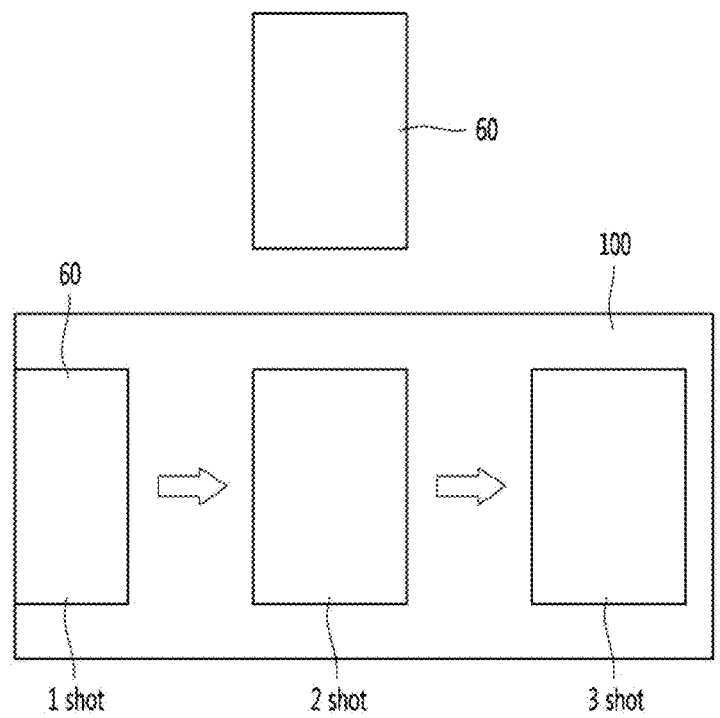
FIG. 13 is a diagram schematically illustrating a process of performing exposure by shifting a mask in accordance with an aspect of the present disclosure.

FIG. 13 is a diagram schematically illustrating a process of performing exposure by shifting a mask in accordance with an aspect of the present disclosure. As illustrated in FIG. 13, according to an aspect of the present disclosure, at least any one of the gate line, the data line, and the bias line may be formed by shifting the mask 60 several times.

That is, the array substrate 100 of the present disclosure is formed on a base substrate by shifting the mask 60 including a plurality of line identifier patterns. Thus, it is possible to accurately detect a position of a defective line without confusion caused by an identifier even in case of the stitch shot exposure method.

A method for manufacturing the X-ray detector of the present disclosure includes the above-described method for manufacturing the array substrate of an X-ray detector.

An X-ray detector manufactured by the method of the present disclosure is exposed using the mask 60 configured to form a plurality of line identifiers. Thus, if a defect occurs in a line of the array substrate, it is possible to accurately track a position of the line. Therefore, it is possible to suppress a defect leakage. Further, it is possible to reduce RMA (Return Material Authorization) costs and remarkably improve the yield.

If necessary, the method for manufacturing the array substrate of an X-ray detector or the method for manufacturing the X-ray detector of the present disclosure may further include other steps generally known in the art within the scope without departing from the purpose of the present disclosure.

The exemplary aspects of the present disclosure can also be described as follows:

According to an aspect of the present disclosure, an array substrate of an X-ray detector may include a first line extended in a first direction, a second line extended in the first direction and apart from the first line, and a plurality of line identifiers arranged between the first line and the second line.

Each of the plurality of line identifiers may include at least one of numbers, letters, symbols, and shapes.

The line may be any one of a gate line, a data line, and a bias line.

According to another aspect of the present disclosure, an array substrate of an X-ray detector may include a line group in which each of n number of lines from a first line to an nth line (n is a natural number) is extended in a first direction and the first line to the nth line are arranged along a second direction perpendicular to the first direction and spaced apart from each other, and a plurality of line identifiers arranged beside an mth line (m is a natural number equal to or smaller than n) of the line group. The plurality of line identifiers may include a first identifier including a number m and a second identifier including a number (m+n).

According to yet another aspect of the present disclosure, an array substrate of an X-ray detector may include a line group in which each of n number of lines from a first line to an nth line (n is a natural number) is extended in a first direction and the first line to the nth line are arranged along a second direction perpendicular to the first direction and spaced apart from each other, and a plurality of line identifiers arranged beside an mth line (m is a natural number equal to or smaller than n) of the line group. The plurality of line identifiers may include a first identifier including a number m and a second identifier including a number (m+n).

According to yet another aspect of the present disclosure, an array substrate of an X-ray detector may include groups of first to nth lines (n is a natural number) including a plurality of lines. The plurality of lines may be extended in a first direction as being apart from each other and may include n number of identifiers on a lateral side.

Xth lines among the plurality of lines included in the groups of first to nth lines may include n number of line identifiers identical to each other.

An X-ray detector of the present disclosure may include the array substrate of an X-ray detector.

According to yet another aspect of the present disclosure, a method for manufacturing an array substrate of an X-ray detector may include forming a gate line on a substrate, forming an active layer on the gate line, forming a source/drain electrode on the active layer, forming a lower electrode on the source/drain electrode, forming a light conductor layer and an upper electrode on the lower electrode, and forming a data line and a bias line on the upper electrode. At least any one of the gate line, the data line, and the bias line may be formed by an exposure process using a mask configured to form a plurality of line identifiers between adjacent lines.

The mask may include a line group pattern in which each of n number of lines from a first line to an nth line (n is a natural number) is arranged as being extended in a first direction and the first line to the nth line are arranged along a second direction perpendicular to the first direction apart from each other, and a plurality of line identifier patterns arranged beside an mth line (m is a natural number equal to or smaller than n) of the line group pattern.

According to an aspect of the present disclosure, at least any one of the gate line, the data line, and the bias line may be formed by shifting the mask several times.

A method for manufacturing an X-ray detector of the present disclosure may include the method for manufacturing an array substrate of an X-ray detector.

It will be understood that the aspects of the present disclosure described above should be considered in a descriptive sense only and not for purposes of limitation. Further, it will be understood by a person having ordinary skill in the art that various other modifications and applications may be made therein without departing from the spirit and scope of the aspects of the disclosure. For example, respective components shown in detail in the aspects of the disclosure may be executed while being modified. Also, it should be construed that differences related to the modification and application are included in the scope of the present disclosure as defined by the following claims.

What is claimed is:

1. An array substrate of an X-ray detector, comprising:
a plurality of line groups (G1, . . . Gp) having a plurality of lines (L1_1, . . . , Lp_n) is arranged in a first direction; and
a plurality of line identifiers is disposed beside each of the plurality of lines (L1_1, . . . , Lp_n),
wherein each of the plurality of line groups (G1, . . . Gp) includes first to $n^{th}$ lines, where n is a natural number, extended in the first direction and spaced apart from each other along a second direction perpendicular to the first direction, and
wherein the plurality of line identifiers includes a first identifier indicating an $m^{th}$ line, where m is a natural number equal to or smaller than n, of a first line group among the plurality of line groups (G1, . . . Gp) and a second identifier indicating an $m^{th}$ line of a second line group among the plurality of line groups (G1, . . . Gp), where p is a natural number greater than 2.

2. The array substrate according to claim 1, wherein the plurality of lines includes at least one of a gate line, a data line, and a bias line.

3. The array substrate according to claim 2, wherein each of the first identifier and the second identifier includes at least one of numbers, letters, symbols, and shapes.

4. The array substrate according to claim 1, wherein the line identifiers of the plurality of lines included in one line group among the first to $p^{th}$ line groups are different from each other.

5. The array substrate according to claim 1, wherein each of the line groups includes first to nth lines, and
wherein an $x^{th}$ lines (where x is a natural number equal to or smaller than n) among the first to nth lines in each of the first to pth line groups have a p number of line identifiers identical to each other.

6. An X-ray detector comprising:
an array substrate having a plurality of pixels, comprising,
a plurality of line groups (G1, . . . Gp) having a plurality of lines (L1_1, . . . , Lp_n) is arranged in a first direction; and
a plurality of line identifiers is disposed beside each of the plurality of lines (L1_1, . . . , Lp_n);
a bias driver supplying a driving voltage to the array substrate;
a gate driver sequentially supplying a gate pulse to a plurality of gates of the array substrate; and
a read-out integrated circuit reading out a detection signal output from a turned-on transistor in response to the gate pulse,
wherein each of the plurality of line groups (G1, . . . Gp) includes first to nth lines, where n is a natural number, extended in the first direction and spaced apart from each other along a second direction perpendicular to the first direction, and
wherein the plurality of line identifiers includes a first identifier indicating an mth line, where m is a natural number equal to or smaller than n, of a first line group among the plurality of line groups (G1, . . . Gp) and a second identifier indicating an mth line of a second line group among the plurality of line groups (G1 . . . Gp) where p is a natural number greater than 2.

7. The X-ray detector according to claim 6, wherein the plurality of lines (L1_1, . . . , Lp_n) include at least one of a gate line, a data line, and a bias line.

8. A method for manufacturing an array substrate of an X-ray detector, comprising:
forming a gate line on a substrate;
forming an active layer on the gate line;
forming source/drain electrodes on the active layer;
forming a lower electrode on the source/drain electrode;
forming a light conductor layer and an upper electrode on the lower electrode; and
forming a data line and a bias line on the upper electrode,
wherein at least one of the gate line, the data line, and the bias line is formed by an exposure process using a mask configured to form a plurality of line identifiers between adjacent lines.

9. The method for manufacturing an array substrate according to claim 8, wherein the mask comprises:
a first pattern for a line group in which each of n number of lines from a first line to an nth line (where n is a natural number) is arranged to extend a first direction and the first line to the nth line are arranged in series along a direction perpendicular to the first direction and spaced apart from each other; and
a second pattern for a plurality of line identifier arranged beside an mth line (where m is a natural number equal to or smaller than n) of the line group.

10. The method for manufacturing an array substrate according to claim 8, wherein the second pattern includes at least one of numbers, letters, symbols, and shapes.

11. The method for manufacturing an array substrate according to claim 8, wherein the at least one of the gate line, the data line, and the bias line is formed by shifting the mask a plurality of times.

12. An array substrate of an X-ray detector, comprising:
a base substrate;
a plurality of gate lines on the base substrate;
an active layer on the gate lines;
source/drain electrodes on the active layer;
a lower electrode of a photosensitive part on the source/drain electrodes;
a light conductor layer and an upper electrode of the photosensitive part on the lower electrode;
a plurality of data lines and a plurality of bias line on the upper electrode; and
a plurality of line identifiers disposed between at least one of the gate lines, the data lines, and the bias lines.

13. The X-ray detector according to claim 12, wherein the plurality of line identifiers includes at least one of numbers, letters, symbols, and shapes.

14. The X-ray detector according to claim 12, wherein the at least one of the gate lines, the data lines and the bias lines comprises:
- a plurality of line groups having a plurality of lines arranged in a first direction; and
- a plurality of line identifiers disposed to be beside of each of the plurality of lines,
- wherein each of the plurality of line groups includes first to nth lines (where n is a natural number) extended in a first direction and disposed to be spaced apart from each other along a second direction perpendicular to the first direction,
- wherein mth lines (where m is a natural number equal to or smaller than n) of an each of the line groups have the line identifiers including a first identifier having a number m and a second identifier having a number (m+n).

15. The X-ray detector according to claim 12, further comprising an insulation layer having a contact hole that exposes a portion of the source/drain electrodes on the source/drain electrodes, wherein the source electrode is connected to the data line and the drain electrode is connected to the lower electrode of the photosensitive part through the contact hole.

\* \* \* \* \*